US012622135B2

(12) United States Patent
Chen et al.

(10) Patent No.: US 12,622,135 B2
(45) Date of Patent: May 5, 2026

(54) ORGANIC LIGHT EMITTING DIODE AND DISPLAY PANEL

(71) Applicant: BOE TECHNOLOGY GROUP CO., LTD., Beijing (CN)

(72) Inventors: Fudong Chen, Beijing (CN); Zhiqiang Jiao, Beijing (CN); Qingyu Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 585 days.

(21) Appl. No.: 17/789,637

(22) PCT Filed: Sep. 13, 2021

(86) PCT No.: PCT/CN2021/117909
§ 371 (c)(1),
(2) Date: Jun. 28, 2022

(87) PCT Pub. No.: WO2022/078138
PCT Pub. Date: Apr. 21, 2022

(65) Prior Publication Data
US 2023/0030283 A1 Feb. 2, 2023

(30) Foreign Application Priority Data
Oct. 12, 2020 (CN) .......................... 202011085227.2

(51) Int. Cl.
*H10K 59/12* (2023.01)
*H10K 50/84* (2023.01)
(Continued)

(52) U.S. Cl.
CPC ........... *H10K 50/858* (2023.02); *H10K 50/84* (2023.02); *H10K 85/633* (2023.02); *H10K 50/11* (2023.02); *H10K 59/12* (2023.02); *H10K 85/626* (2023.02)

(58) Field of Classification Search
CPC .... H10K 50/858; H10K 50/84; H10K 85/633; H10K 50/11; H10K 59/12; H10K 85/626;
(Continued)

(56) References Cited

U.S. PATENT DOCUMENTS 8,618,574 B2 * 12/2013 Kumaki ............... H10K 50/165
257/103
9,508,956 B2 11/2016 Shinotsuka et al.
(Continued)

FOREIGN PATENT DOCUMENTS

CN 104218165 A 12/2014
CN 104335679 A 2/2015
(Continued)

OTHER PUBLICATIONS

Satoh; Ryuichi, KR-20140048796-A, Machine Translation (Year: 2014).*

*Primary Examiner* — Jacob Y Choi
*Assistant Examiner* — Grace Cha
(74) *Attorney, Agent, or Firm* — HOUTTEMAN LAW LLC

(57) ABSTRACT

The present disclosure provides an organic light emitting diode and a display panel. The organic light emitting diode includes: a base; a micro-nano structure layer on a side of the base; a first electrode on a side of the micro-nano structure layer away from the base; an electroluminescence layer on a side of the first electrode away from the micro-nano structure layer; and a second electrode on a side of the electroluminescence layer away from the first electrode.

3 Claims, 2 Drawing Sheets

(51) Int. Cl.
    *H10K 50/858*     (2023.01)
    *H10K 85/60*      (2023.01)
    *H10K 50/11*      (2023.01)

(58) Field of Classification Search
    CPC .. H10K 59/38; H10K 59/80515; H10K 50/85;
                             H10K 2102/3026
    See application file for complete search history.

(56)                 References Cited

U.S. PATENT DOCUMENTS

| | | | |
|---|---|---|---|
| 9,660,217 B2 | 5/2017 | Fukuda et al. | |
| 10,581,029 B2 | 3/2020 | Wang et al. | |
| 2003/0057417 A1* | 3/2003 | Lee | H10K 50/858 |
| | | | 257/40 |
| 2008/0163923 A1* | 7/2008 | Park | H01G 9/2031 |
| | | | 136/248 |
| 2009/0079342 A1 | 3/2009 | Kumaki et al. | |
| 2015/0034925 A1* | 2/2015 | Shinotsuka | H10K 50/858 |
| | | | 257/40 |
| 2016/0293879 A1 | 10/2016 | Chen et al. | |
| 2020/0273918 A1* | 8/2020 | Bang | H10K 59/35 |

FOREIGN PATENT DOCUMENTS

| | | | |
|---|---|---|---|
| CN | 105280667 A | 1/2016 | |
| CN | 105453697 A | 3/2016 | |
| CN | 106992266 A | 7/2017 | |
| CN | 112186124 A | 1/2021 | |
| KR | 20140048796 A | * 4/2014 | H10K 50/858 |

\* cited by examiner

ORGANIC LIGHT EMITTING DIODE AND DISPLAY PANEL

TECHNICAL FIELD

The present disclosure relates to display technology, and in particular, to an organic light emitting diode and a display panel.

BACKGROUND

An Organic Light Emitting Diode (OLED) has become a standard accessory for a high-end display due to its advantages of self-luminescence, high brightness, high contrast, fast response, and the like.

OLED devices may be divided into bottom-emitting type devices and top-emitting type devices based on a photon outgoing surface. Due to a small aperture ratio of a bottom-emitting type device when the bottom-emitting type device is applied to a display panel, a top-emitting type device is mainly applied to a small and medium-sized, portable apparatus, and the like.

SUMMARY

According to an aspect of the present disclosure, an organic light emitting diode is provided. The organic light emitting diode includes: a base; a micro-nano structure layer on a side of the base; a first electrode on a side of the micro-nano structure layer away from the base; an electroluminescence layer on a side of the first electrode away from the micro-nano structure layer; and a second electrode on a side of the electroluminescence layer away from the first electrode.

Optionally, the micro-nano structure layer includes a first grating and/or a photonic crystal.

Optionally, the organic light emitting diode further includes a protective layer between the electroluminescence layer and the second electrode.

Optionally, grating structures are provided on a side of the first electrode away from the micro-nano structure layer, on a side of the electroluminescence layer away from the first electrode, and on a side of the second electrode close to the protective layer; a period of each grating structure is the same as a period of the first grating or the photonic crystal; orthographic projections on the base of convexes and concaves of the grating structure on the side of the first electrode away from the micro-nano structure layer and orthographic projections on the base of convexes and concaves of the grating structure on the side of the electroluminescence layer away from the first electrode at least partially overlap with orthographic projections on the base of convexes and concaves of the first grating or the photonic crystal, respectively; orthographic projections on the base of convexes of the grating structure on the side of the second electrode close to the protective layer at least partially overlap with the orthographic projections on the base of the concaves of the first grating or the photonic crystal; and orthographic projection on the base of concaves of the grating structure on the side of the second electrode close to the protective layer at least partially overlap with the orthographic projections on the base of the convexes of the first grating or the photonic crystal.

Optionally, the first electrode includes a first indium tin oxide layer, a first silver layer, and a second indium tin oxide layer provided sequentially in a direction away from the base.

Optionally, the second electrode includes a first indium zinc oxide layer.

Optionally, the protective layer includes a first inorganic dielectric layer, a first organic semiconductor layer and a second inorganic dielectric layer provided sequentially in the direction away from the base.

Optionally, a material of the first inorganic dielectric layer and of the second inorganic dielectric layer includes molybdenum trioxide; and a material of the first organic semiconductor layer includes N, N'-diphenyl-N, N'-(1-naphthyl)-1, 1'-biphenyl-4, 4'-diamine.

Optionally, the organic light emitting diode further includes an encapsulation layer on a side of the second electrode away from the electroluminescence layer.

According to another aspect of the present disclosure, a display panel is provided. The display panel includes the above organic light emitting diode and a driving circuit for driving the organic light emitting diode.

BRIEF DESCRIPTION OF DRAWINGS

In order to more clearly illustrate the technical solutions in the embodiments of the present disclosure or in the related art, drawings used in the description of the embodiments or the related art will be briefly described below.

DETAIL DESCRIPTION OF EMBODIMENTS

In order to enable one of ordinary skill in the art to better understand the technical solutions of the present disclosure, the present disclosure will be described in further detail below with reference to the accompanying drawings and the detailed description.

A cathode of a top-emitting type OLED device is typically made of a film of metal Mg (magnesium) or Ag (silver). The cathode has low light transmittance, so that a large number of photons cannot be outgoing. Thus, the efficiency of the OLED device can be enhanced only by a gain of a microcavity. However, since the microcavity not only has inconsistent gain effect for respective bands of colors, but also causes a severe color shift in a viewing angle, an optical cavity of the OLED device needs to be precisely designed and fully considered in display. In addition, the cathode of the top-emitting type OLED device may be made of Indium Zinc Oxide (IZO). The cathode made of IZO (IZO cathode) has high light transmittance (>90%), does not have the problem of the microcavity for a metal film (low reflectivity), and has low requirement on the optical design of the OLED device (especially an OLED emitting white light).

However, the IZO as a cathode material has the following two problems: (1) a sputter process is adopted for forming the IZO cathode, the process condition of the sputter process is harsh, and high-energy particles caused by magnetron sputter easily cause physical damage to an electroluminescent organic film under the IZO cathode, such that the OLED device is subjected to electric leakage and even short circuit; and (2) the IZO cathode has low reflectivity, so that a strong gain of a microcavity cannot be obtained, resulting in low efficiency of the OLED device.

Figure 1:
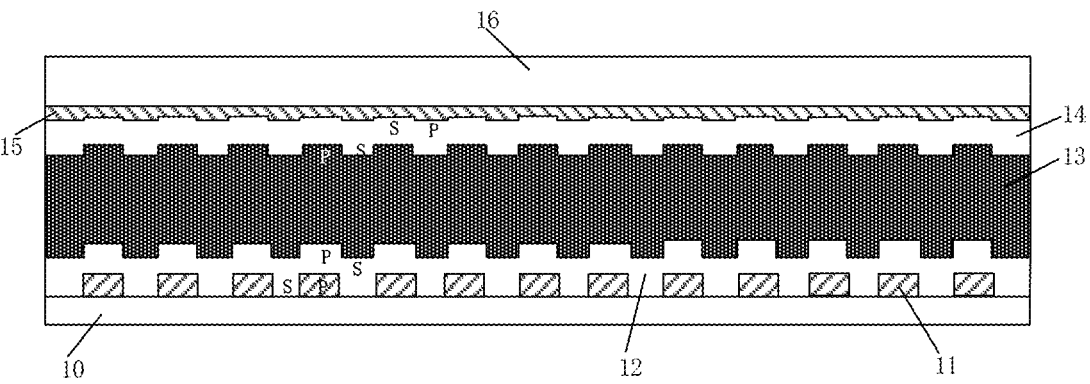
FIG. 1 is a schematic diagram illustrating a structure of an organic light emitting diode according to an embodiment of the present disclosure.

Accordingly, an organic light emitting diode (OLED) is provided in the present disclosure, and FIG. 1 is a schematic diagram illustrating a structure of an organic light emitting diode according to an embodiment of the present disclosure. As shown in FIG. 1, the OLED includes: a base 10; a micro-nano structure layer 11 on a side of the base 10; a first electrode 12 on a side of the micro-nano structure layer 11 away from the base 10; an electroluminescence (EL) layer 13 on a side of the first electrode 12 away from the micro-nano structure layer 11; and a second electrode 15 on a side of the EL layer 13 away from the first electrode 12.

In the present disclosure, the micro-nano structure layer 11 is provided on the base 10 of the OLED, and the micro-nano structure layer 11 may destroy the waveguide effect inside the OLED device and the surface plasmon polariton (SPP) effect of a reflective anode (e.g., the first electrode 12), thereby alleviating the dissipation of photons inside the device and the color shift in the viewing angle in display.

Specifically, the micro-nano structure layer 11 may include any one of a first grating and a photonic crystal, that is, the micro-nano structure layer 11 may be a grating structure or photonic crystals, as shown in FIG. 1. A photonic crystal is an artificial periodic dielectric structure with photonic band gap characteristics. The photonic crystal has a wavelength selection function, to selectively allow light of a certain band to pass therethrough and to prevent light of other bands from passing therethrough. A grating is an optical device constituted of a large number of parallel slits with an equal width and an equal spacing between any two adjacent slits. The grating has a corresponding period for selecting light of a corresponding wavelength to pass therethrough. The first gratings or the photonic crystals are provided, so that light, which is emitted by the OLED and may not be emitted out from the device due to total reflection (or waveguide effect) in the device, may be emitted out from the device, so that the photon outgoing efficiency is enhanced, and the dissipation of photons inside the device is relieved. Moreover, due to the diffraction of the first grating or the photonic crystal, a visual angle of the display panel can be increased, and a color shift of the display panel is relieved. The period of the first grating and of the photonic crystal and the materials thereof may be set based on the color of emergent light.

Optionally, in addition to the EL layer 13, the organic light emitting diode may further include a hole injection layer, a hole transport layer, an electron transport layer, and an electron injection layer sequentially provided on the side of the micro-nano structure layer 11 away from the base 10, and the EL layer 13 is provided between the hole transport layer and the electron transport layer. The second electrode 15 as a cathode of the organic light emitting diode is generally provided on a side of the electron injection layer away from the base 10. The electron injection layer may be made of NPB (N, N'-diphenyl-N, N'-(1-naphthyl)-1, 1'-biphenyl-4, 4'-diamine) material doped with lithium ions +Li.

In some embodiments, as shown in FIG. 1, the organic light emitting diode further includes a protective layer 14 between the EL layer 13 and the second electrode 15 and for protecting the layers under the protective layer 14.

Figure 2:
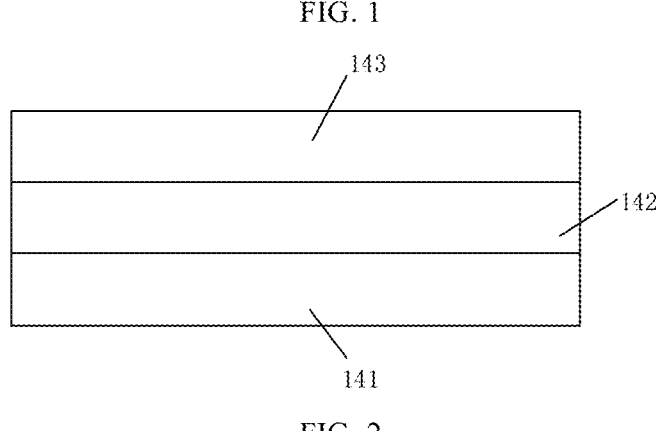
FIG. 2 is a schematic diagram illustrating a structure of a protective layer according to an embodiment of the disclosure.

FIG. 2 is a schematic diagram illustrating a structure of a protective layer according to an embodiment of the disclosure. As shown in FIG. 2, the protective layer 14 includes a first inorganic dielectric layer 141, a first organic semiconductor layer 142, and a second inorganic dielectric layer 143 sequentially provided in a direction away from the base 10. The protective layer 14 of the three-layer structure can prevent the damage to the electroluminescence layer under the protective layer 14 when the second electrode 15 (such as an IZO cathode) made of an IZO material is formed through a sputter process, thereby relieving serious leakage of the IZO cathode. With the laminated arrangement of inorganic dielectric layer/organic semiconductor layer/inorganic dielectric layer, the damage due to the formation of the IZO cathode is relieved obviously (i.e., the leakage rate can be reduced from 20% to 5%). In a specific example, a material of the first inorganic dielectric layer 141 and of the second inorganic dielectric layer 143 includes molybdenum trioxide ($MoO_3$), and a material of the first organic semiconductor layer 142 includes NPB, i.e., the protective layer 14 is a three-layer structure of $MoO_3/NPB/MoO_3$. A thickness of each layer of the three-layer structure is not limited as long as the thickness meets the overall size requirement of the manufactured device.

Figure 3:
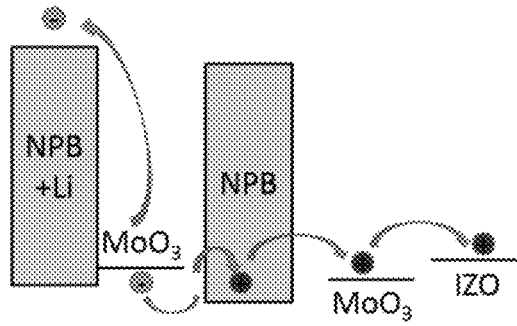
FIG. 3 is a schematic diagram illustrating charge migration in a protective layer according to an embodiment of the present disclosure.

FIG. 3 is a schematic diagram illustrating carrier migration in a protective layer according to an embodiment of the present disclosure, which shows a direction of charge migration when the above $MoO_3/NPB/MoO_3$ structure is adopted as the protective layer 14. Charges reach the electron injection layer NPB+Li through the protective layer 14 of the three-layer structure. The protective layer 14 may form a dense protective film layer, which can solve the damage to the electroluminescence layer 13 during the formation of the IZO cathode.

In some embodiments, as shown in FIG. 1, grating structures are provided on a side of the first electrode 12 away from the micro-nano structure layer 11, on a side of the electroluminescence layer 13 away from the first electrode 12, and on a side of the second electrode 15 close to the protective layer 14, respectively; and a period of each of the grating structures is the same as a period of the first grating or the photonic crystal. Orthographic projections, on the base 10, of a plurality of convexes P and of a plurality of concaves S of the grating structure on the side of the first electrode 12 away from the micro-nano structure layer 11, and orthographic projections, on the base 10, of a plurality of convexes P and a plurality of concaves S of the grating structure on the side of the electroluminescence layer 13 away from the first electrode 12, at least partially overlap orthographic projections of a plurality of convexes P and a plurality of concaves S of the first grating or the photonic crystal on the base 10, respectively. Orthographic projections, on the base 10, of a plurality of convexes P of the grating structure on the side of the second electrode 15 close to the protective layer 14 at least partially overlap orthographic projections of the plurality of concaves S of the first grating or the photonic crystal on the base 10, respectively; and orthographic projections, on the base 10, of a plurality of concaves S of the grating structure on the side of the second electrode 15 close to the protective layer 14 at least partially overlap orthographic projections of the plurality of convexes P of the first grating or the photonic crystal on the base 10, respectively. Accordingly, a grating structure is further provide on a side of the electroluminescence layer 13 close to the first electrode 12, and a plurality of convexes and a plurality of concaves of the grating structure correspond to the plurality of concaves and the plurality of convexes of the first electrode 12, respectively. Meanwhile, a plurality of concaves and a plurality of convexes are provided on a side of the protective layer 14 close to the second electrode 15 and on a side of the protective layer 14 close to the electroluminescence layer 13, respectively and correspond to the plurality of convexes and the plurality of concaves of the second electrode 15 and the electroluminescence layer 13, respectively. That is, since the micro-nano structure layer 11 is provided in the OLED, other layers have similar grating structures, thereby enhancing the photon outgoing efficiency.

Figure 4:
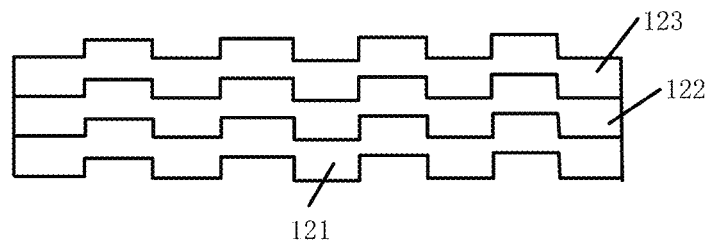
FIG. 4 is a schematic diagram illustrating a structure of a first electrode according to an embodiment of the present disclosure.

In some embodiments, the first electrode 12 as a anode of the OLED includes a first indium tin oxide (ITO) layer 121, a first silver (Ag) layer 122, and a second indium tin oxide (ITO) layer 123 sequentially provided in a direction away from the base 10, as shown in FIG. 4. Since the first electrode 12 has the metal Ag, SPP effect is easily caused on a metal Ag interface, and the micro-nano structure layer 11 in the OLED can relieve or even eliminate the SPP effect.

In some embodiments, the second electrode 15 as the cathode of the OLED includes a first indium zinc oxide (IZO) layer. The first IZO layer has high light transmittance, and is particularly suitable for a top-emitting type OLED device. Moreover, since the IZO has non-metal characteristics, the SPP effect can be avoided, which is beneficial to enhancing the light outgoing efficiency.

In some embodiments, a part of the first indium tin oxide layer 121 of the first electrode 12 is filled in the concaves S of the first grating or in the concaves S of the photonic crystal, thereby achieving good bonding of the first grating or the photonic crystal to the first electrode 12.

In some embodiments, the OLED further includes an encapsulation layer 16 on a side of the second electrode 15 away from the EL layer 13 and for encapsulating the OLED, as shown in FIG. 1. The encapsulation layer 16 may include a first inorganic encapsulation film layer, an organic encapsulation film layer, and a second inorganic encapsulation film layer sequentially stacked in a direction away from the base 10. The first inorganic encapsulation film layer and the second inorganic encapsulation film layer are used for preventing water and oxygen from entering a display device in a display area from a display side of a display panel. The first inorganic encapsulation film layer and the second inorganic encapsulation film layer may be made of an inorganic material, such as silicon nitride, silicon oxide and the like. The organic encapsulation film layer is used for realizing planarization, and may be made of a material, such as acrylic-based polymers, silicon-based polymers and the like.

When the OLED is manufactured, firstly, a micro-nano structure layer, such as a first grating or a photonic crystal, is formed on a base; and thereafter, a first electrode layer 12, an EL layer 13, a protective layer 14, a second electrode layer 15, and an encapsulation layer 16 are sequentially formed.

Specifically, the method of manufacturing an OLED includes the following steps. Firstly, a first grating or a photonic crystal is formed on a base 10. For example, the first grating is formed by an electron beam lithography technique, a nano-imprint technique, a holographic exposure technique, or the like; and the photonic crystal is formed by dielectric rod stacking, precision mechanical drilling, colloidal particle self-organization growth, colloidal solution self-organization growth, a semiconductor process, or the like. Then, an ITO material, Ag, and an ITO material are sequentially deposited on the base on which the first grating or the photonic crystal is formed and are patterned, to form a first indium tin oxide (ITO) layer 121, a first silver (Ag) layer 122, and a second indium tin oxide layer 123, thereby forming the first electrode layer 12. Then, an organic electroluminescent material is deposited on the first electrode layer 12 and subjected to a patterning process to form the EL layer 13. Then, an inorganic dielectric material (e.g., $MoO_3$), an organic semiconductor material (e.g., NPB), and an inorganic dielectric material (e.g., $MoO_3$) are sequentially deposited on the EL layer 13, to form a first inorganic dielectric layer 141, a first organic semiconductor layer 142, and a second inorganic dielectric layer 143, respectively, thereby forming the protective layer 14. Then, an IZO material is deposited on the protective layer 14 to form the second electrode layer 15. Finally, an inorganic material such as silicon nitride and silicon oxide, an organic material such as acrylic-based polymer and silicon-based polymer, and an inorganic material such as silicon nitride and silicon oxide are sequentially deposited on the second electrode layer 15 to form a first inorganic encapsulation film layer, an organic encapsulation film layer, and a second inorganic encapsulation film layer, respectively, thereby forming the encapsulation layer 16.

The photon outgoing efficiency of the OLED in the above embodiments can be enhanced, and a color shift in a viewing angle is relieved, such that a top-emitting type OLED device with high efficiency, wide viewing angle and low damage may be provided.

According to another aspect of the present disclosure, a display panel is further provided. The display panel includes the above OLED and further includes a driving circuit for driving the OLED.

Figure 5:
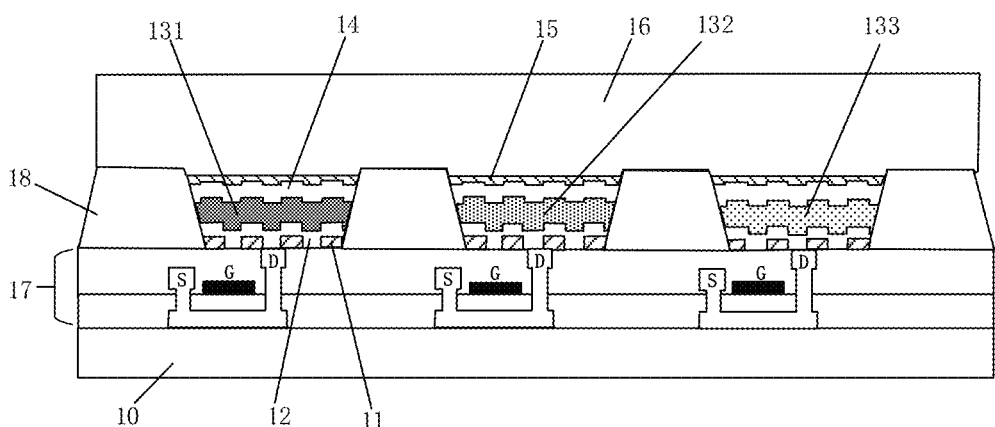
FIG. 5 is a schematic diagram illustrating a structure of a display panel according to an embodiment of the present disclosure.

FIG. 5 is a schematic diagram illustrating a structure of a display panel according to an embodiment of the present disclosure, and shows a schematic cross-sectional view of an RGB three-primary-color display panel. The display panel includes a base 10 and a driving circuit layer 17 on the base 10. The driving circuit layer 17 includes driving circuits. Each driving circuit includes a driving transistor including a source electrode S, a drain electrode D, and a gate electrode G. The drain electrode D of the driving transistor is electrically connected to a first electrode 12 (i.e., an anode) of an OLED.

Specifically, in the display panel, a micro-nano structure layer 11 (e.g., a first grating) is provided on a side of the anode (e.g., the first electrode 12) of the OLED close to the base 10. A part of a first indium tin oxide (ITO) layer 121 in the anode of the OLED fills the spaces in the first grating to achieve bonding of the first grating to the anode of the OLED. A first silver (Ag) layer 122 and a second indium tin oxide layer 123 of the anode of the OLED are provided on the first indium tin oxide (ITO) layer 121, thereby forming a reflective anode having a triple-layer structure of ITO/Ag/ITO. The SPP effect of a metal Ag interface in the reflective anode can be relieved or even eliminated by the micro-nano structure layer. An electroluminescence (EL) layer is provided on a side of the reflective anode away from the base, and the EL layer may include a first EL sub-layer 131 emitting red light, a second EL sub-layer 132 emitting green light and a third EL sub-layer 133 emitting blue light. A protective layer is provided on a side of the EL layer away from the base 10, and the protective layer is consisted of three layers of inorganic dielectric layer/organic semiconductor layer/inorganic dielectric layer (e.g., $MoO_3$/NPB/

$MoO_3$). The protective layer may form a dense protective film layer by means of the structure of the inorganic dielectric layer/organic semiconductor layer/inorganic dielectric layer, and the damage to the EL layer in the subsequent manufacturing process of an IZO cathode is eliminated. An IZO cathode is provided on a side of the protective layer away from the base. An encapsulation layer 16 is provided on a side of the IZO cathode away from the base 10, and the encapsulation layer 16 covers OLEDs that emit various colors of light. In addition, the OLED consisted of the micro-nano structure layer, the anode, the EL layer, the protective layer, and the IZO cathode is located in an opening of a pixel defining layer 18. In the display panel, the SPP effect due to a metal interface in the top-emitting type device and a color shift in a viewing angle due to a microcavity can be relieved or even eliminated by the micro-nano structure layer and the non-metal cathode IZO, and meanwhile, the photon outgoing efficiency is enhanced. In the display panel, the damage to the EL layer due to the formation of the IZO cathode can be eliminated by the protective layer.

Figure 6:
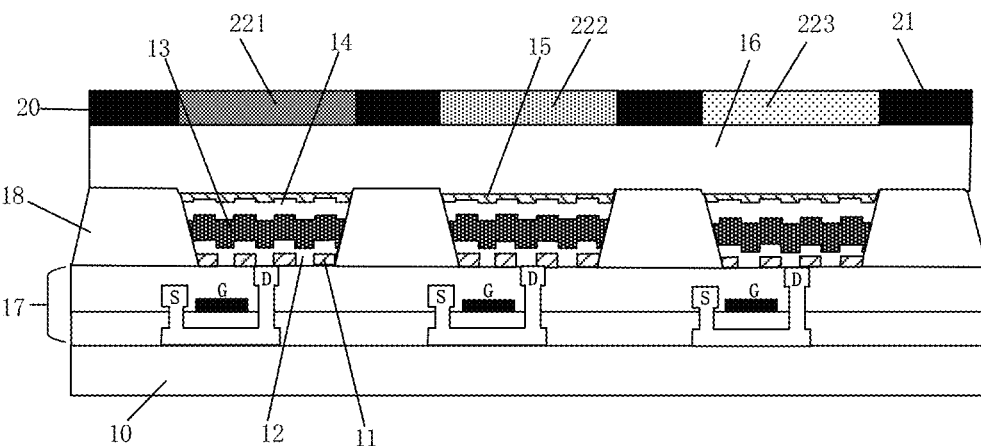
FIG. 6 is a schematic diagram illustrating a structure of a display panel according to an embodiment of the present disclosure.

FIG. 6 is a schematic diagram illustrating another structure of a display panel according to an embodiment of the present disclosure. The display panel further includes a color filter substrate 20 for filtering light emitted by the OLED to enhance the purity of the emitted light. The color filter substrate 20 includes a red filter 221, a green filter 222, a blue filter 223, and black matrixes 21 between every two filters.

Specifically, in the display panel, a micro-nano structure layer 11 (e.g., a first grating) is provided on a side of the anode (e.g., the first electrode 12) of the OLED close to the base 10. A part of the first indium tin oxide (ITO) layer 121 in the anode of the OLED fills the spaces in the first grating to achieve bonding of the first grating to the anode of the OLED. A first silver (Ag) layer 122 and a second indium tin oxide layer 123 of the anode of the OLED are provided on the first indium tin oxide (ITO) layer 121, thereby forming a reflective anode having a triple-layer structure of ITO/Ag/ITO. The SPP effect of a metal Ag interface in the reflective anode can be relieved or even eliminated by the micro-nano structure layer. An EL layer is provided on a side of the reflective anode away from the base. Dopants of light emitting materials of multiple colors may be co-evaporated in the same EL layer, thereby causing the EL layer to emit white light. A protective layer is provided on a side of the EL layer away from the base 10, and the protective layer is consisted of three layers of inorganic dielectric layer/organic semiconductor layer/inorganic dielectric layer (e.g., $MoO_3$/NPB/$MoO_3$). The protective layer may form a dense protective film layer by means of the structure of the inorganic dielectric layer/organic semiconductor layer/inorganic dielectric layer, and the damage to the EL layer in the subsequent manufacturing process of an IZO cathode is eliminated. An IZO cathode is provided on a side of the protective layer away from the base. An encapsulation layer 16 and a color film substrate 20 are sequentially provided on a side of the IZO cathode away from the base 10. The micro-nano structure layer, the anode, the EL layer, the protective layer, and the IZO cathode are located in an opening of a pixel defining layer 18. In the display panel, by the micro-nano structure and the non-metal cathode IZO, not only the SPP effect due to a metal interface in the top-emitting type device can be relieved or even eliminated, but also poor selective gain of the microcavity can be relieved, so that the adjustment process of the optical cavity is greatly simplified, and the light outgoing efficiency is enhanced.

The damage to the EL layer during forming the IZO cathode can be eliminated by the protective layer.

It will be understood that, the above embodiments are merely exemplary embodiments employed to illustrate the principles of the present disclosure, and the present disclosure is not limited thereto. It will be apparent to one of ordinary skill in the art that various changes and modifications can be made therein without departing from the spirit and scope of the present disclosure, and these changes and modifications are to be considered within the scope of the present disclosure.

What is claimed is:

1. A display panel, comprising a base, a driving circuit layer on the base, a plurality of organic light emitting diodes on a side of the driving circuit layer away from the base, and, a color filter substrate on a side of the plurality of organic light emitting diodes away from the base;

wherein the driving circuit layer comprises a plurality of driving circuits for driving the plurality of organic light emitting diodes;

wherein the color filter substrate includes a plurality of filters in one-to-one correspondence with the plurality of organic light emitting diodes and black matrixes between every two filters, and the plurality of filters include red filters, green filters, blue filters;

wherein each organic light emitting diode comprises:

a micro-nano structure layer on a side of the driving circuit layer away from the base;

a first electrode on a side of the micro-nano structure layer away from the base;

an electroluminescence layer on a side of the first electrode away from the micro-nano structure layer; and a second electrode on a side of the electroluminescence layer away from the first electrode;

wherein the micro-nano structure layer comprises a photonic crystal;

each organic light emitting diode further comprises a protective layer between the electroluminescence layer and the second electrode, and an encapsulation layer on a side of the second electrode away from the electroluminescence layer;

the second electrode comprises a first indium zinc oxide layer;

the protective layer comprises a first inorganic dielectric layer, a first organic semiconductor layer and a second inorganic dielectric layer arranged sequentially in the direction away from the base;

a material of the first inorganic dielectric layer and the second inorganic dielectric layer comprises molybdenum trioxide; and a material of the first organic semiconductor layer comprises N, N'-diphenyl-N, N'-(1-naphthyl)-1,1'-biphenyl-4, 4'-diamine;

wherein the color filter substrate is located on a side of the encapsulation layer of each organic light emitting diode away from the base;

the first electrode has a portion filled in concaves of the photonic crystal; and each driving circuit includes a driving transistor located between the base and the micro-nano structure layer and including a drain electrode, which is electrically connected to and in direct contact with the portion of the first electrode of its corresponding organic light emitting diode.

2. The display panel of claim 1, wherein each organic light emitting diode further comprises grating structures provided on a side of the first electrode away from the micro-nano structure layer, on a side of the electroluminescence layer away from the first electrode, and on a side of the second electrode close to the protective layer, respectively;

a period of each of the grating structures is the same as a period of the photonic crystal;

orthographic projections, on the base, of convexes and concaves of the grating structure on the side of the first electrode away from the micro-nano structure layer and orthographic projections, on the base, of convexes and concaves of the grating structure on the side of the electroluminescence layer away from the first electrode at least partially overlap orthographic projections of convexes and concaves of the photonic crystal on the base, respectively;

orthographic projections, on the base, of convexes of the grating structure on the side of the second electrode close to the protective layer at least partially overlap the orthographic projections of the concaves of the photonic crystal on the base; and orthographic projections, on the base, of concaves of the grating structure on the side of the second electrode close to the protective layer at least partially overlap the orthographic projections of the convexes of the photonic crystal on the base.

3. The display panel of claim 2, wherein the first electrode comprises a first indium tin oxide layer, a first silver layer, and a second indium tin oxide layer arranged sequentially in a direction away from the base.

\* \* \* \* \*